(12) United States Patent
Carter et al.

(10) Patent No.: US 8,351,234 B2
(45) Date of Patent: Jan. 8, 2013

(54) EXTENSIBLE THREE DIMENSIONAL CIRCUIT HAVING PARALLEL ARRAY CHANNELS

(75) Inventors: Richard J. Carter, Los Altos, CA (US); Frederick Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 359 days.

(21) Appl. No.: 12/770,539

(22) Filed: Apr. 29, 2010

(65) Prior Publication Data

US 2011/0267866 A1 Nov. 3, 2011

(51) Int. Cl.
*G11C 5/06* (2006.01)

(52) U.S. Cl. ............................... 365/63; 365/39; 365/51

(58) Field of Classification Search ................. 365/63, 365/39, 51
See application file for complete search history.

(56) References Cited

U.S. PATENT DOCUMENTS

| | | | |
|---|---|---|---|
| 7,495,978 B2 | 2/2009 | Hasegawa et al. | |
| 7,589,368 B2 | 9/2009 | Lee | |
| 7,593,246 B2 | 9/2009 | Shepard | |
| 7,763,978 B2 * | 7/2010 | Wu et al. | 257/758 |
| 7,902,869 B1 * | 3/2011 | Carter | 326/41 |
| 8,023,307 B1 * | 9/2011 | Carter et al. | 365/130 |
| 2008/0130342 A1 * | 6/2008 | Zhang | 365/51 |
| 2009/0262583 A1 | 10/2009 | Lue et al. | |
| 2012/0001654 A1 * | 1/2012 | Strukov et al. | 326/41 |

OTHER PUBLICATIONS

Kichul Kim, et al.; "Latin Squares for Parallel Array Access"; IEEE Transactions on Parallel and Distributed Systems; Apr. 1993; pp. 361-370; vol. 4; No. 4.

* cited by examiner

*Primary Examiner* — Connie Yoha (57) ABSTRACT

An extensible three dimensional circuit having parallel array channels includes an access layer and crossbar array layers overlying the access layer and being electrically connected to the access layer. The crossbar array layers include parallel channels, the parallel channels being formed from two classes of vias, the first class being pillar vias connected to relatively short stub lines, and the second class being traveling-line vias connected to long lines that travel away from the via; pillar vias and traveling-line vias being configured to connect to crossing lines such that each crossing point between the lines is uniquely addressed by one pillar via and one traveling-line via. Programmable crosspoint devices are disposed between the crossing lines.

20 Claims, 7 Drawing Sheets

EXTENSIBLE THREE DIMENSIONAL CIRCUIT HAVING PARALLEL ARRAY CHANNELS

STATEMENT OF GOVERNMENT INTEREST

This invention has been made with government support under Contract No. HR0011-09-3-0001, awarded by the Defense Advanced Research Project Agency. The government has certain rights in the invention.

BACKGROUND

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

There are many metrics that can be used to evaluate a three dimensional circuit, and many trade-offs that can be made between metric-affecting parameters in any given design. For example, extensibility, addressability, density, edge effects, active layer via spacing, and trace topology may all be metrics which are used to evaluate and optimize the performance of a three dimensional circuit. Specific examples of these metrics are given below for a multilayer three dimensional memory circuit.

Extensibility—What limits are there to the number of array layers in the three dimensional memory circuit?

Addressability—How easily can the system translate between the logical address of a memory element and the physical address of the control vias of that element?

Density—How well is each array layer utilized compared to a layer hypothetically populated with memory elements at maximum lithographic density? Is the design amenable to "double density" techniques in which memory elements are formed on both sides of a given metal trace?

Edge Effects—Is there wasted memory capacity at the periphery of the array layers or control issues with undriven traces? Do the edge effects disrupt the regular addressability of memory elements by the system?

Active Layer Via Spacing—Since the minimum feature size of the array layers may be less than that of the active drive-circuit layer, are the vias spaced out enough to be connected to by the active circuits?

Trace topology—Relating to issues of inductive and resistive voltage drops and electromigration, are the row and column lines single long snaking lines or are they pillars with many short trace stubs attached? Can the vias be "fattened" to address these concerns without excessively disrupting the density or other design parameters?

One challenge in designing and manufacturing three dimensional circuits is to find a balance between the relevant metrics. For example, some designs are extensible but have a fine-grained structure that make addressability and edge effect handling difficult. Other designs that are easily addressable with no edge effects have low limits to the number of array layers. The illustrative designs below describe solutions which balance the relevant metrics to produce three dimensional circuits which are extensible, mitigate the edge effects, and are easily addressable. Other metrics such as memory density, active layer spacing, and trace topology are also addressed.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Figure 1:
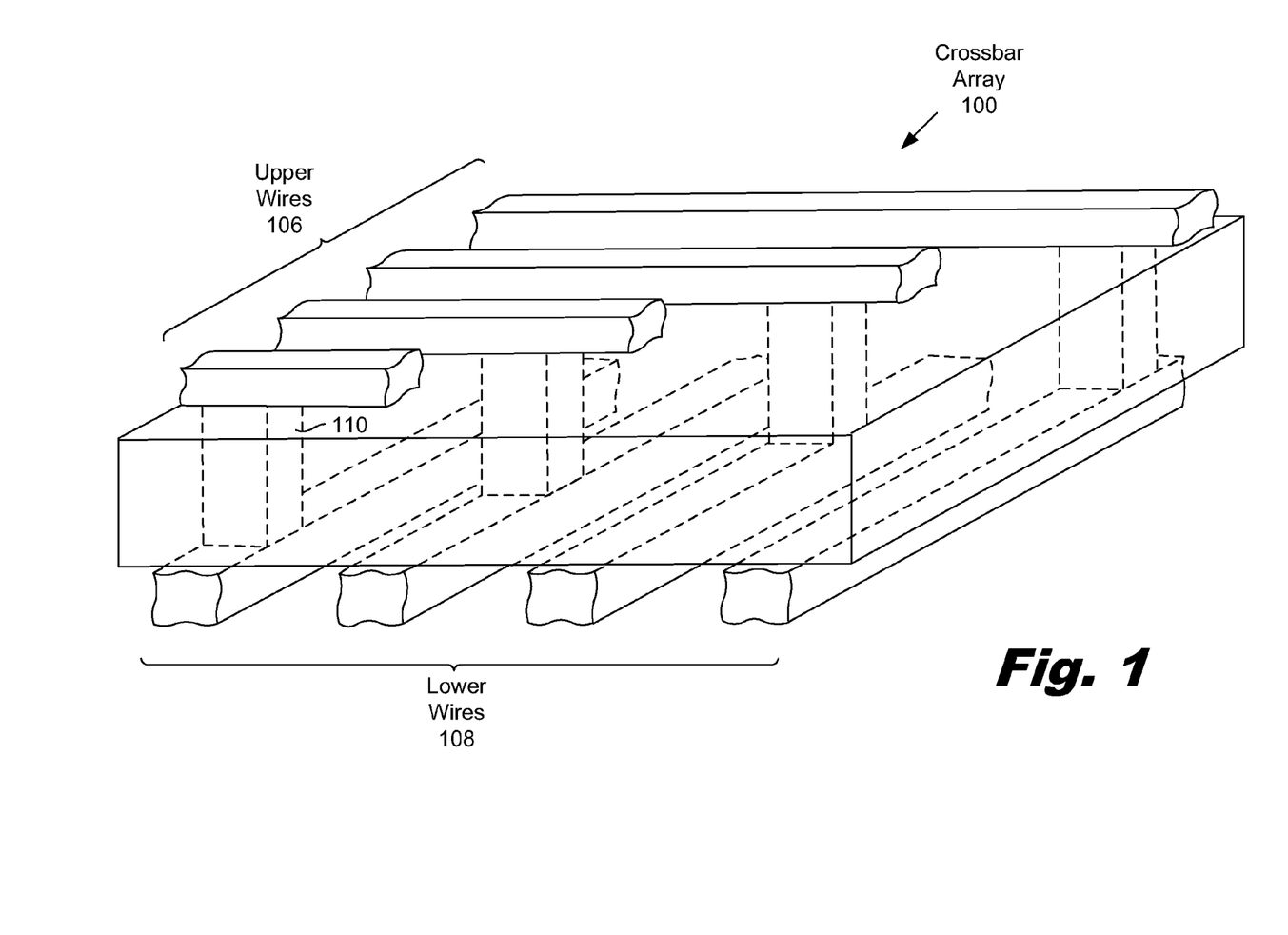
FIG. 1 is a perspective view of an illustrative crossbar array, according to one embodiment of principles described herein.

FIG. 1 is a diagram of an illustrative crossbar array (100). The crossbar array (100) includes upper crossbar wires (106) which are generally parallel. In this illustrative embodiment, a second group of lower crossbar wires (108) are substantially perpendicular to and cross the first group of lines (106). According to one illustrative embodiment, programmable crosspoint devices (110) are formed between crossing lines. The programmable crosspoint devices (110) may be configured in a variety of ways. For example, the programmable crosspoint devices (110) may be configured as programmable fuses or as part of a neural network. In some embodiments, the programmable crosspoint devices (110) may be configured as memory elements. The crossbar array (100) may include a variety of different types of programmable crosspoint devices (110) to accomplish its function. For example, a crossbar architecture can be used to form implication logic structures and crossbar based adaptive circuits such as artificial neural networks. The crossbar array (100), with its higher planar device density, has several advantages over conventional circuitry including higher capacity and/or smaller planar area.

As used in the specification and appended claims, a crossbar array includes a set of upper crossbar wires, a set of lower crossbar wires which cross the upper crossbar wires at a non-zero angle, and programmable crosspoint devices interposed between the wires at their crossing points.

According to one illustrative embodiment, the programmable crosspoint devices (110) are memristive devices. Memristive devices are described in U.S. Patent App. Pub. No. 2008/0079029, entitled "Multi-terminal Electrically Actuated Switch" and U.S. Patent App. Pub. No. 2008/009033, entitled "Electrically Actuated Switch", both to R. Stanley Williams, which are hereby incorporated in their entirety. Additionally or alternatively, the programmable crosspoint devices (110) may include memcapacitive devices. Various illustrative embodiments of memcapacitive devices are described in PCT Application No. PCT/US2009/047164 to Dmitri Strukov et al., entitled "Capacitive Crossbar Arrays" filed Jun. 12, 2009, which is incorporated by reference in its entirety.

Throughout the specifications and appended claims, the term "programmable crosspoint device" refers to a broad family of devices or technologies which provide the ability to program and sense state changes in devices which are interposed between crossing conductive elements. The term "memristive device" or "memristor" refers to a specific type of programmable crosspoint device which uses dopant motion within a matrix to alter the resistive state of the device.

Memristive devices exhibit a "memory" of past electrical conditions. For example, a memristive device may include a matrix material which contains mobile dopants. These dopants can be moved within a matrix to dynamically alter the electrical operation of an electrical device. The motion of dopants can be induced by the application of a programming electrical voltage across a suitable matrix. The programming voltage generates a relatively high electrical field through the memristive matrix and alters the distribution of dopants within the matrix. After removal of the electrical field, the location and characteristics of the dopants remain stable until the application of another programming electrical field. These changing dopant configurations within a matrix produce changes in the electrical resistance or other characteristics of the device.

The memristive device can be read by applying a lower reading voltage which allows the internal electrical resistance of the memristive device to be sensed but does not generate a high enough electrical field to cause significant dopant motion. According to one illustrative embodiment, the memristive device exhibits a rectifying behavior similar to Schottky diode. The state of the memristive device can be read by applying a full forward voltage bias across a specified junction while reverse biasing other memristive devices in the array to suppress leakage currents.

Each of the memristive crosspoint devices (110) may be used to represent one or more bits of data. For example, in the simplest case, memristive crosspoint devices (110) may have two states: a conductive state and a nonconductive state. The conductive state may represent a binary "1" and the nonconductive state may represent a binary "0", or vice versa. Binary data can be written into the crossbar array (100) by changing the conductive state of the memristive crosspoint devices (110). The binary data can then be retrieved by sensing the state of the memristive crosspoint devices (110). Additionally or alternatively, the crossbar array (100) can incorporate memristive crosspoint devices (110) which have more than two states.

There are a wide variety of interconnection architectures which can incorporate the illustrative principles described below. For example, PCT Application No. PCT/US2009/039666, to Dmitri Strukov et al., entitled "Three Dimensional Multilayer Circuit," filed Apr. 6, 2009, describes various three dimensional interconnection schemes and is incorporated by reference in its entirety. Additionally, various illustrative applications and examples of multilayer circuits which incorporate crossbar interconnections are given in "Nano/CMOS architectures using a field-programmable nanowire interconnect", Gregory Snider et al., Nanotechnology 18, 035204 (2007) which is incorporated by reference herein in its entirety.

For purposes of illustration, the following examples assume a three dimensional memory circuit includes an access layer with area-distributed access gates. The connections are made between the access gates and the overlying crossbar layer by vertical vias. The access layer may have a number of different forms, including complementary metal-oxide-semiconductor (CMOS) or other conventional computer circuitry. This CMOS circuitry can provide additional functionality to the memristive device such as input/output functions, buffering, logic, or other functionality. In addition to the area distributed configuration illustrated, the principles described could also be applied to access layers with peripherally distributed access devices. Overlying the access layer are multiple crossbar array layers. A crossbar array layer includes two classes of parallel control lines that cross each other, with programmable crosspoint devices formed where pairs of control lines cross. To distinguish the two control line classes, they will be termed "row lines" and "column lines."

According to the illustrative embodiments discussed below, extensible three dimensional circuits may be organized so that each array layer includes a number of parallel array channels. The channels are formed between densely spaced via pillars arranged in parallel rows. Assuming these vias support the row lines of the memory, then the other class of control lines, the column lines, travel along the channels formed by the row line vias, in alternating orthogonal directions. This permits the column lines to travel away from their original active circuit layer connection point and interconnect with a large number of row lines. This traveling action enables a practically unbounded number of array layers. Meanwhile, the regularity of the channel organization permits clean handling of edge effects through column line direction reversal and peripheral loopback signals. The regular channel organization and complete edge effect handling result in simple memory element addressability. Memory array layer utilization is on par with the best of other 3D memory circuit designs, and "fat column vias" can be accommodated as necessary to support higher currents with minimal impact.

Throughout the specification and appended claims, the cardinal directions (north, south, east, west) are used to indicate directionality. "North" is used to indicate a direction which is upward on the page; "south" is used to indicate a direction which is downward on the page; "east" is used to indicate a direction which is to the right on the page; and "west" is used to indicate a direction which is to the left on the page. These descriptions of directionality are used for purposes of description and do not limit the structures to specific orientations.

Figure 2A:
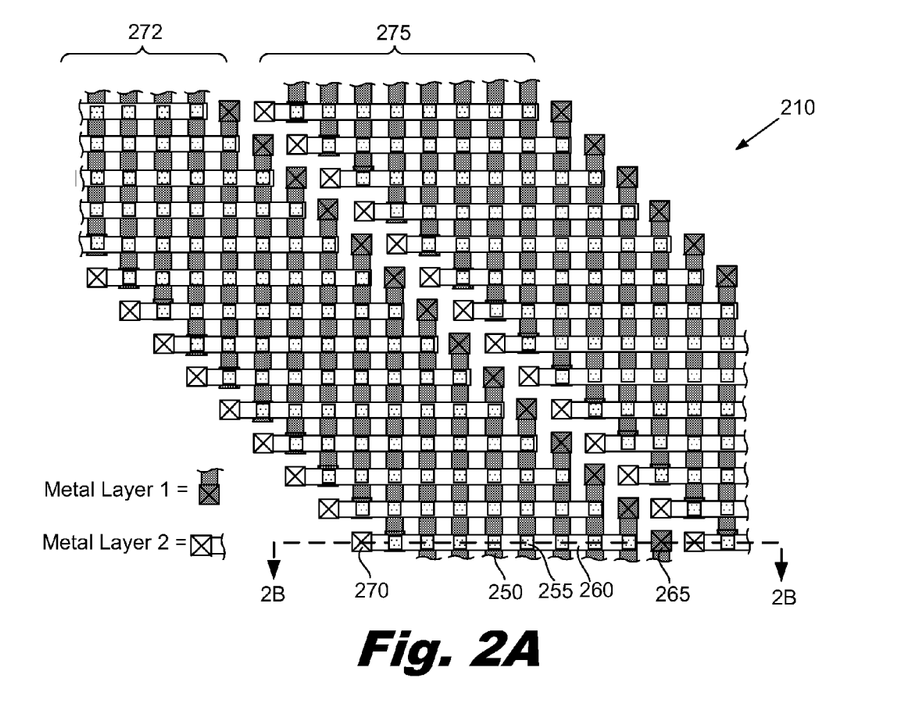
FIG. 2A is a diagram of a first crossbar array in an illustrative extensible three dimensional circuit having parallel channels, according to one embodiment of principles described herein.
Figure 2B:
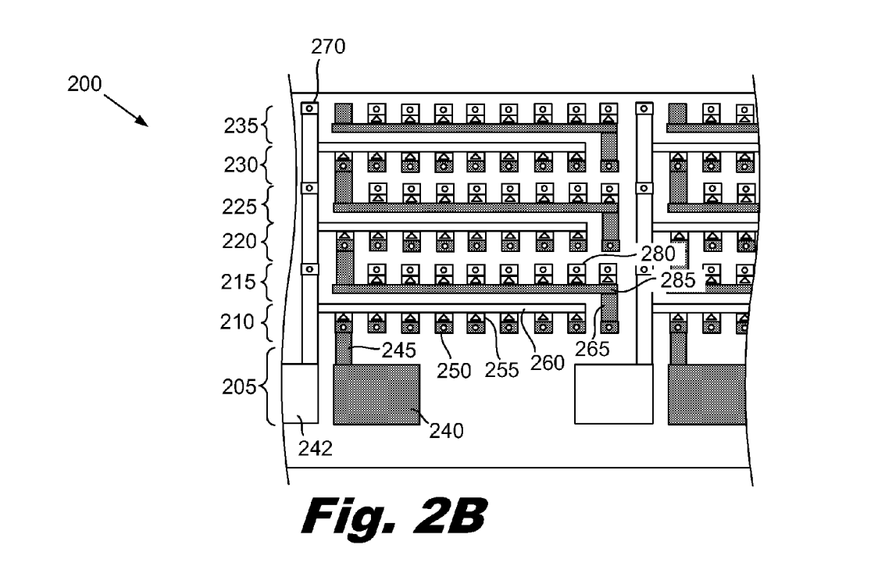
FIG. 2B is a cross sectional diagram of an illustrative extensible three dimensional circuit having parallel channels, according to one embodiment of principles described herein.

FIG. 2A is a diagram of a first crossbar array layer (210) in an illustrative extensible three dimensional circuit (200) having parallel channels (270, 275). FIG. 2B is a cross sectional diagram of an illustrative extensible three dimensional circuit (200) having parallel channels. Referring first to FIG. 2B, the bottommost layer of the circuit (200) is a CMOS layer (205) and includes gates (240, 242) which selectively access conductive paths of the three dimensional circuit (200). Above the CMOS layer (205) a number of crossbar array layers (210-235) are formed. As discussed with respect to FIG. 1, each of the crossbar array layers (210-235) include two groups of crossing lines, with a programmable crosspoint device interposed between the lines at each crossing point. For convenience, a first group of lines (250, 285) are designated as column lines and are shaded. A second group of lines (260, 280) are designated as row lines and are unshaded. The designation of row and column lines is arbitrary. The shaded column lines and the unshaded row lines may be illustrated as horizontal or vertical and their orientation may vary from figure to figure.

In each crossbar array (210-235), programmable crosspoint devices (255) are interposed between the column lines (250, 285) and the row lines (260, 280). In this illustrative embodiment, the column lines (250, 285) are on the bottom of each array and the row lines (260, 280) are on the top of each array with the programmable crosspoint devices (255) in the center.

Row vias (270) connect the row lines (260, 280) to an underlying access gate. In this embodiment, the row vias (270) form a pillar through circuit (200) and the row lines (260, 280) extend from the pillar in various directions. The row lines (260, 280), or pillar stubs, are electrically connected to and extend radially outward from the pillar vias (270). Similarly, column vias (245, 265) interconnect the column lines (250, 285). As described below, the column lines (250, 285) travel through a parallel channel. As the column lines (250, 285) travel through the parallel channel (272, 275), they encounter new row lines and form unique interconnections.

As illustrated in FIG. 2B, the gates (240, 242) in the CMOS layer (205) can be significantly larger than the lines they are attached to. Consequently, it can be difficult to achieve optimal packing density of the gates (240, 242) in the CMOS layer (205) and optimal packing density of the programmable crossbar devices (255) in the crossbar arrays (210-235) at the same time. One challenge is to connect the gates (240, 242) to the lines in the overlying crossbar arrays (210-235). Where the bottom of the lines is directly exposed to the underlying CMOS layer (205), the gates (240, 242) can be placed anywhere along a line and connected to the line by a vertical via. This situation is illustrated in FIG. 2B for the column lines (250). There are no other structures or layers between the bottom layer of column lines (250) and the CMOS layer (205). Consequently, there is some amount of design freedom in placing the column access gates (240) beneath the column lines (250). However, the row lines (260) are not directly accessible from the CMOS layer (205). Consequently, the row gates (242) are located immediately below the row vias (270) or a one-time wiring layer can be used. Where a one-time wiring layer is used, the row gates (242) can be located anywhere in the proximity of the row via (270). The one time wiring layer can then route the row gate (242) to the appropriate row via (270).

In the specification and appended claims, the term "pillar lines" refers to lines or groups of lines which travel vertically, but not laterally through a three dimensional circuit except through stubs that are each a fraction of the full line length. Pillar lines maintain the same vertical via footprint in all layers. Vias which are connected to the "pillar lines" are called "pillar vias." The term "travelling lines" refers to lines or groups of lines which move both vertically and laterally through a three dimensional circuit. Vias which are connected to the "traveling lines" are called "traveling-line vias."

FIG. 2A is a plan view of a first crossbar layer (210) of the three dimensional circuit (200). A dashed line 2B-2B is the line along which the cross sectional view of FIG. 2B is taken. FIG. 2A shows the channels (272, 275) which travel diagonally across the circuit. In practice these channels (272, 275) would typically be much longer and have other adjacent channels on either side. For purposes of illustration, enlarged views of two short sections of the channels are shown. The circuit (200) would typically include a large number of channels which extend across the circuit. The channels (272, 275) may be closely packed together as shown in FIG. 2A or the channels (272, 275) may have to be spaced with some amount of distance in between them. The lines (250, 260) may have widths which range from tens of microns to nanometers. In this illustrative embodiment, each line segment (250, 260) crosses eight other line segments and is used to address eight programmable crosspoint devices (255) on each array layer. The length of the line segments (250, 260) and the number of programmable crosspoint devices (255) may be more or less than illustrated in FIG. 2A.

FIG. 2A illustrates the underlying column lines (250) which are shaded and are in metal layer 1. The overlying row lines (260) are unshaded and are in metal layer 2. As discussed above, the row lines (260) are connected to the underlying CMOS access gates by the row vias (270). The column lines (250) are connected by column vias (265). In the first crossbar layer (210) the row lines (260) run east/west and the column lines (250) run north/south.

Figure 3:
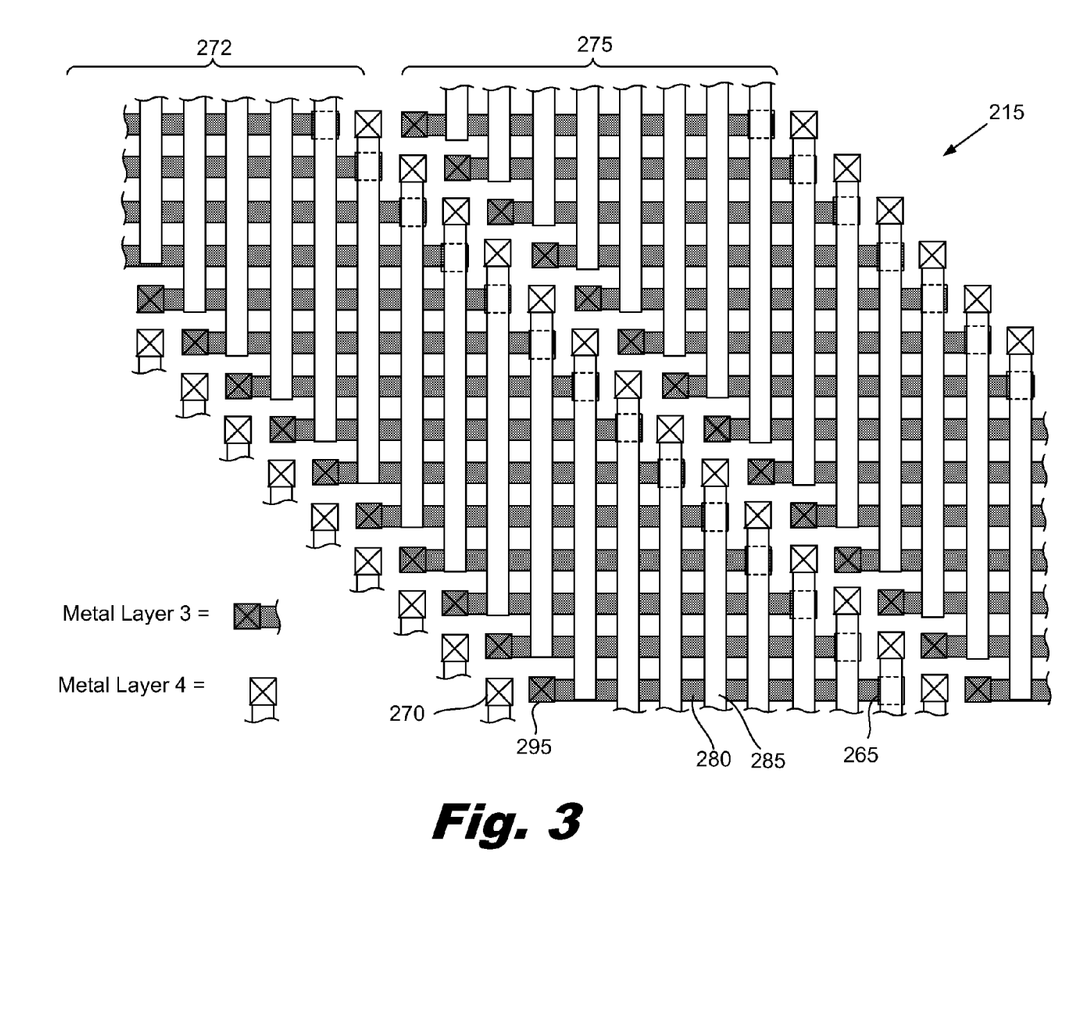
FIG. 3 is a diagram of a second crossbar array in an illustrative extensible three dimensional circuit having parallel channels, according to one embodiment of principles described herein.

FIG. 3 shows the second layer (215) of the three dimensional circuit (200). The two diagonal channels (272, 275) continue in this layer. Metal layer 3 includes column lines (280) which run from east to west. Metal layer 4 forms the row lines (285) which extend southward from the row vias (270). An interconnection column via (265) connects the column lines (250, FIG. 2A) in the first metal layer to the column lines (280) in the third metal layer. At the left end of each column line (280), a second interconnection column via (295) extends upward to connect column line (280) in metal layer 3 to an overlying column line in the third crossbar array layer (220, FIG. 2B). Because the interconnected column lines alternatively travel north/south then east/west, they zigzag upward through the channel and encounter new row lines at each level.

Figure 4:
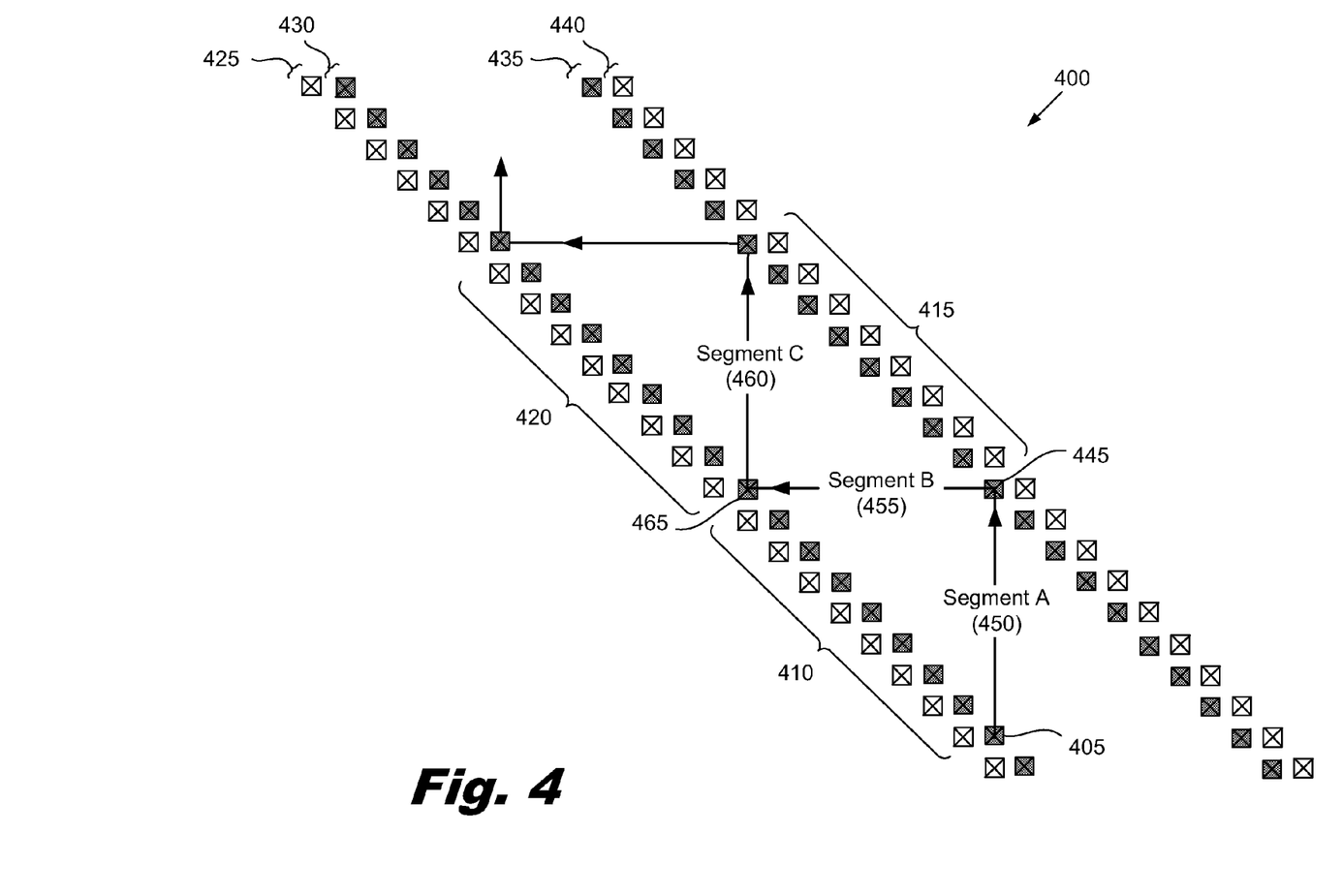
FIG. 4 is a diagram of a path of a traveling line through a parallel channel of an illustrative extensible three dimensional circuit, according to one embodiment of principles described herein.

FIG. 4 is a diagram of a path of a traveling column line through a channel of an illustrative extensible three dimensional circuit (400). In this illustrative embodiment, via (405) extends upward from the CMOS layer and connects to segment A (450) of a column line. Segment A (450) is located in the first crossbar array (210, FIG. 2B) and addresses crosspoint devices in coordination with a first group of row lines (410). At the north end of segment A, an interconnection column via (445) passes upward into the second crossbar array (215, FIG. 2B) and connects segment A (450) to segment B (455) of the column line. As discussed above, in this crossbar layer (215, FIG. 2B) the column lines travel from east to west and cross row lines traveling from north to south. Consequently, segment B (455) addresses crosspoint devices in coordination with a second group of row lines (415).

At the west end of segment B (455) an interconnection via (465) extends upward into a third crossbar array (220, FIG. 2B) and connects segment B (455) to segment C (460). Segment C (460) addresses crosspoint devices in coordination with a third group of column lines (420). These unique row line/column line pairings allow for unique addressing of each of the programmable crosspoint devices. According to one illustrative embodiment, this pattern continues through all layers of the circuit until the traveling column line encounters the uppermost layer or the edge of the circuit. Although the path of only one column line is shown in FIG. 4, the other column lines travel similar paths.

Figure 5:
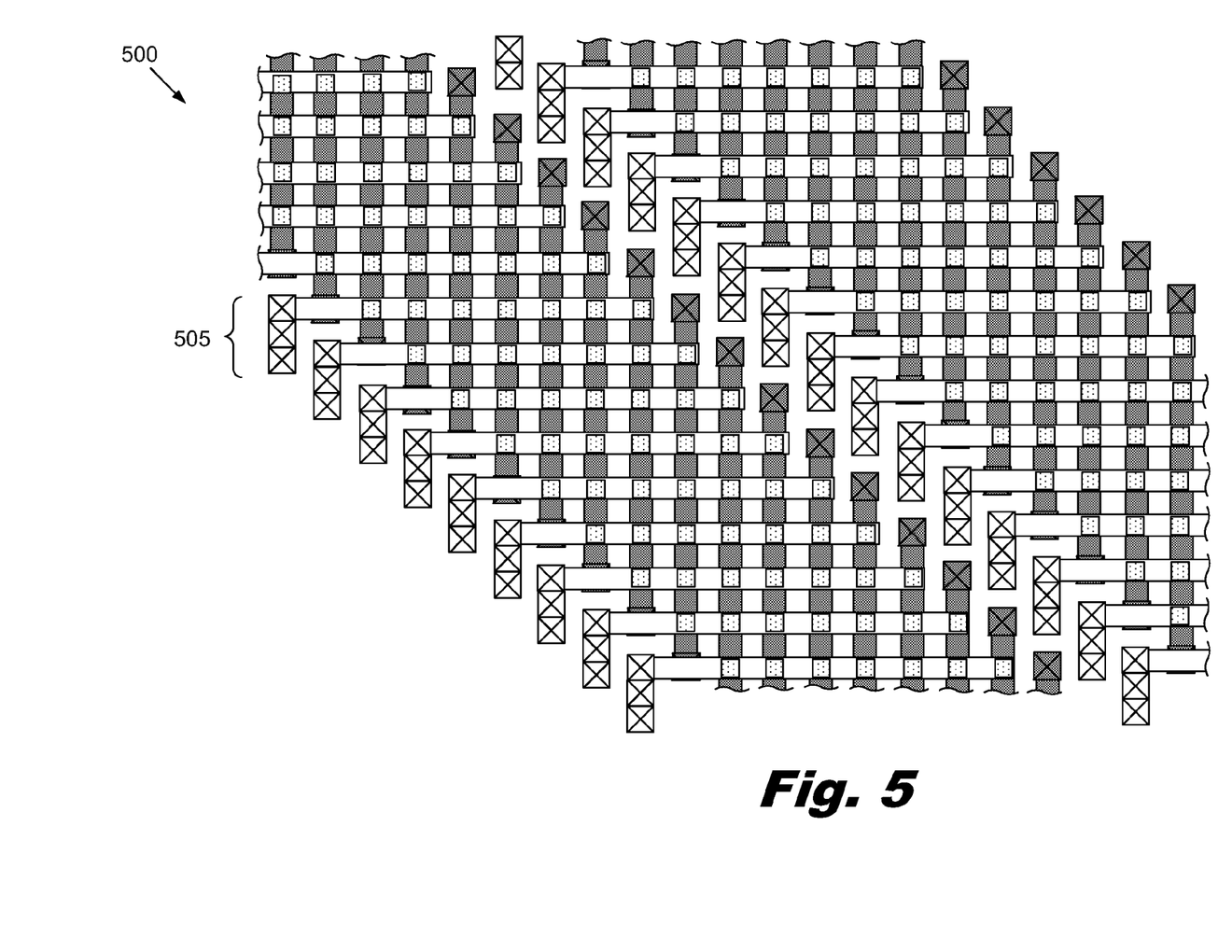
FIG. 5 is a diagram of an illustrative extensible three dimensional circuit with enhanced pillar connections, according to one embodiment of principles described herein.

FIG. 5 is a diagram of a first array layer of an illustrative extensible three dimensional circuit (500) with enhanced pillar vias (505). As the number of layers in the three dimensional circuit increases, the length of the column and row lines increases. As the length of the wires increases, their electrical resistance also increases. To obtain the desired functionality, it may be desirable to decrease the electrical resistance of the lines.

One technique to decrease the electrical resistance of the lines is to increase the cross sectional area of the lines. In some manufacturing processes, increasing the vertical thickness of the wire segments that move laterally within an array layer can be relatively simple. This can create a situation where the cross section of vias is the limiting factor. High row via resistance may be particularly limiting when the row via is to carry the current of many fully-selected memory elements during a full-row read operation. FIG. 5 shows an illustrative embodiment where the vertical row vias (505) are enhanced to have a greater cross sectional area. This "fat via" cross section reduces the resistance of the row vias (505) so that they can carry the combined read currents which are generated when reading multiple programmable crosspoint devices attached to the row vias.

As discussed above, traveling lines can create a number of undesirable edge effects, including undriven and underutilized lines. One principle of handling edge effects is for traveling lines to go in both directions in equal numbers, so that the number of undriven lines that need to be sourced into a given side of the circuit equals the number of traveling lines that emerge from that side. One subtle aspect involves how the loopback connections are made. First, the loopback connections are not made to the nearest channel, since the traveling column lines have already created memory element connections to the row vias on both sides of the channel. By looping back to the nearest channel, memory elements with non-unique row and column line pair connections would be created. Consequently, the loopback connections are made to a nonadjacent channel so that additional unique connections are formed.

Figure 6:
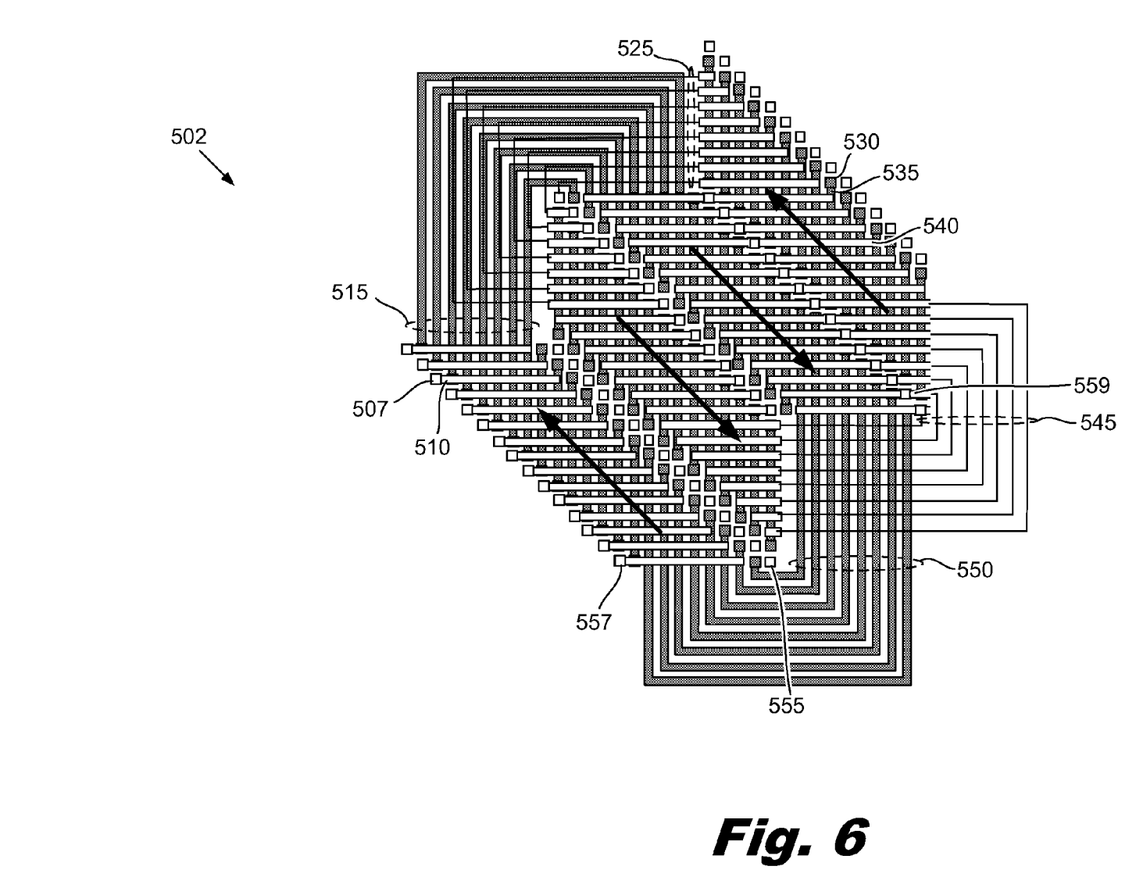
FIG. 6 is a diagram of illustrative overlapping loopback connections for a first crossbar array of an extensible three dimensional circuit having parallel channels, according to one embodiment of principles described herein.

FIG. 6 is a diagram of a first array layer of an illustrative three dimensional circuit (502) which has alternating directions of column line travel along the parallel channels and utilizes loop back traces (515, 525, 550, 545) at the periphery of the circuit. This resolves the edge effect created by the termination of the column and row lines (510, 535) at the periphery of the circuit by looping the row and column lines back into the circuit (502). To effectively loop the lines back into the circuit (502), the direction of travel within the parallel channels alternates. Arrows show the direction of travel in each of the four parallel channels. For purposes of description, the leftmost of the four parallel channels will be referred to as the first channel, the second from the left as the second channel and so forth.

In the first channel, the direction of travel of the column lines (535) is on alternate layers first upward and then toward the left. In this channel, there are a number of underutilized column lines on its upper edge. Loopback traces (515) connect these underutilized column lines to otherwise undriven column lines in the third parallel channel. At the bottom edge of the first channel there a number of undriven column lines which are connected to underutilized column lines at the bottom of the third channel by loop back traces (550).

In the second channel, the direction of travel of the column lines is on alternate layers first downward and then to the right. In this channel, there are a number of underutilized row lines that emerge from the circuit (502) on its upper edge. Loopback traces (525) connect these underutilized row lines to undriven row lines in the fourth parallel channel. At the bottom edge of the second channel there a number of undriven row lines which are connected to underutilized row lines that emerge from the circuit (502) at the bottom of the fourth channel by loop back traces (545). Combining the undriven lines with the underutilized emerging lines forms lines with a full complement of crosspoint devices for each row and column line. This resolves a number of issues, including eliminating gaps in the addressing scheme which are not useable and eliminating floating lines which may interfere with the operation of the circuit.

The loopback traces (515, 525, 545, 550) are formed in the same two metal layers as the row and column lines. For example, loopback traces (515, 550) which connect the column lines (535) are formed in the same metal layer as the column lines and loopback traces (525 545) which connect the row lines (510) are formed in the same metal layer as the row lines. As shown in FIG. 2B, these metal layers are separated by an insulating layer which can contain, where selectively desired, the programmable crosspoint devices. For purposes of illustration, this insulating layer has been illustrated as being transparent. Consequently, even through the loopback traces (515, 525, 545, 555) overlap each other, they do not make electrical contact because they are separated by the insulating layer. Further, no memristive connections are formed between the overlapping loopback lines, since their creation in these locations disrupts the regular addressability of the array and so has been omitted. Relatively thick lines are used to illustrate loopback traces (515, 550) which are associated with column lines (535) and thin lines are used to illustrate loopback traces (525, 545) associated with the row lines (510). However, this is for purposes of illustration. In practice, the loopback traces (515, 525, 545, 550) may have comparable widths.

In the array layer of FIG. 6, the row lines (510) extend east and west from row vias (507) to cross column lines (535) which extend north and south from column vias (530). A line of row vias (555) between the first and second channels does not have any attached row lines in this layer. Other lines of row vias (557) have row lines which extend in only one direction. Yet another line of row vias (559) have row lines which extend in both directions. As each line of row vias (555,557,559) pass upward through the circuit, the configurations of row lines which attach to the row vias may change in each layer. For example, the line of row vias (555) between the first and second parallel channels may have no row lines attached in the first layer, yet row lines which extend in two directions in the second layer.

Figure 7:
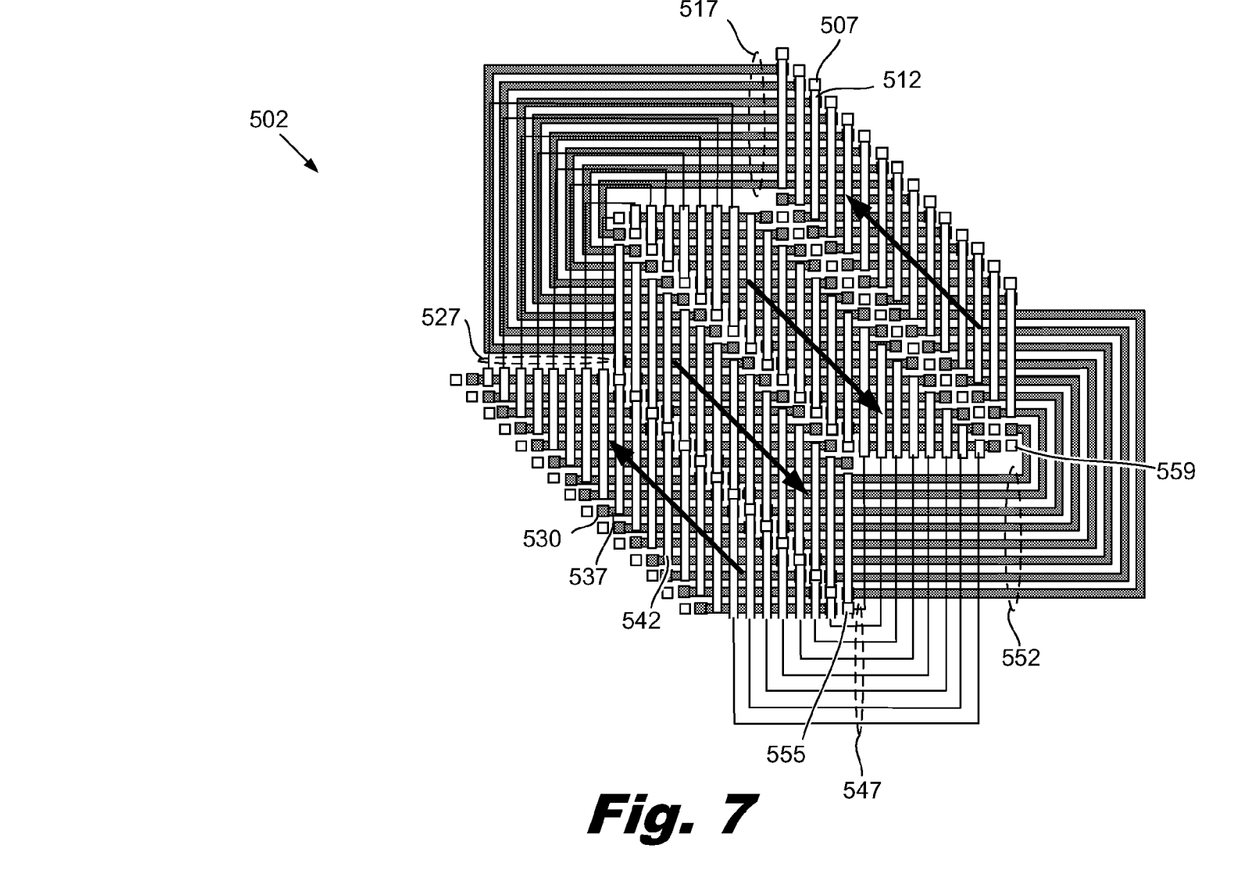
FIG. 7 is a diagram of illustrative overlapping loopback connections for a second crossbar array of an extensible three dimensional circuit having parallel channels, according to one embodiment of principles described herein.

FIG. 7 is a diagram of a second crossbar array layer of an illustrative three dimensional circuit (502). The second crossbar array layer of the three dimensional circuit has parallel channels as illustrated in FIG. 6. In this crossbar array layer, the row lines (542) travel north/south and the column lines (537) travel east/west, which is opposite that shown in the first layer illustrated in FIG. 6. However, the overall motion of the traveling column lines (537) remains the same in each parallel channel throughout the circuit. This is illustrated by the arrows in each parallel channel.

As discussed above, loop back traces (517, 527, 552, 547) can be used at the periphery of the circuit to connect undriven lines to emerging underutilized lines. This resolves the edge effect created by the termination of the column and row lines at the periphery of the circuit by looping the row and column lines back into the circuit (502).

In the first channel, the column lines (537) extend to the west and terminate on this layer at the column vias (530) that connect the column lines (537) to the overlying array layer. In the crossbar array layer of FIG. 7, row lines (542) extend both north and south from the line of row vias (555) between the first and second channels. The row vias (559) between the third and fourth channels do not have any row lines attached. The uppermost line of row vias (507) has row lines (512) which extend southward. According to one illustrative embodiment, these changes in the number and direction of the row lines attached to the row vias does not impact the full row line utilization when an even number of layers is used in the design.

As illustrated in FIGS. 6 and 7, the loopback traces use a significant amount of area compared to the crossbar arrays. This is because the crossbar arrays have been artificially truncated for purposes of illustration. In practice, the length of the channels in the crossbar array could be significantly longer and the overhead created by the loopback traces could be substantially lower.

As discussed above, a number of metrics can be used to evaluate three dimensional circuit designs. The list below describes the performance of the circuit described with respect to several metrics.

Extensibility—practically unbounded (by this it is meant that the number of layers can grow until a row via shares a memory element with all other column vias, or until some electrical limitation is reached)

Addressability—Fairly simple for practical numbers of layers

Density—If the number of memory elements formed by a row line stub is N, then the density can be represented as $$\frac{N}{(N+2)}.$$

Edge Effects—Parallel channels with alternating directions of travel and the utilizing loopback traces at the periphery provide a simple and compact method for resolving edge effects.

Trace topology—Here the row vias have a pillar configuration, which is advantageous if the row vias is to carry the current of many fully-selected memory elements during a full-row read operation. The column vias are long, but such is unavoidable if unique addressability is to be achieved with every-increasing layer counts. The design easily accommodates fattened row vias, as shown in FIG. 5.

In sum, the designs described above include a number of parallel channels with one class of lines remaining fundamentally stationary and the other class of lines traveling through the channels. The designs are extensible with simple addressing and edge effects that can be handled by a variety of direction-reversing techniques and loopback traces. The designs have a very high programmable crosspoint device density. The trace topology includes: row vias are pillars and the row lines are short stubs, while column lines travel through the circuit to encounter new row lines. These designs have row vias that can be "fattened" in one dimension without disrupting the approach. These principles provide a superior interconnection architecture which resolves edge effects and reduce connection complexity.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. An extensible three dimensional circuit having parallel array channels comprising:
    an access layer;
    crossbar array layers overlying the access layer and being electrically connected to the access layer, the crossbar array layers comprising parallel array channels, the parallel channels being formed from two classes of vias, the first class being pillar vias and the second class being traveling-line vias; the pillar vias extend upward through all layers in the circuit, pillar stubs being electrically connected to and extend laterally outward from the pillar vias; pillar vias and traveling-line vias being configured to connect to crossing lines such that each crossing point between the lines is uniquely addressed by one pillar via and one traveling-line via; and
    programmable crosspoint devices disposed between the crossing lines.

2. The circuit of claim 1, in which interconnection vias make connections between traveling lines in adjacent array layers.

3. The circuit of claim 2, in which the traveling lines in adjacent array layers are oriented in orthogonal directions such that a traveling line traces a path which zigzags through a parallel array channel upward through the circuit.

4. The circuit of claim 3, in which the pillar lines are perpendicular to the traveling lines in all crossbar arrays.

5. The circuit of claim 1, in which the traveling lines are oriented along a first channel in an opposite direction than the traveling lines in at least one adjacent channel.

6. An extensible three dimensional circuit having parallel array channels comprising:
    an access layer;
    crossbar array layers overlying the access layer and being electrically connected to the access layer, the crossbar array layers comprising parallel array channels, the parallel channels being formed from two classes of vias, the first class being pillar vias and the second class being traveling-line vias; the pillar vias extend upward through all layers in the circuit, pillar stubs being electrically connected to and extend laterally outward from the pillar vias; pillar vias and traveling-line vias being configured to connect to crossing lines such that each crossing point between the lines is uniquely addressed by one pillar via and one traveling-line via;
    programmable crosspoint devices disposed between the crossing lines; and
    loopback connections made between emerging underutilized lines and undriven lines at the periphery of the circuit.

7. The circuit of claim 6, in which the loopback traces connect a first bundle of traveling lines in a first direction to a second bundle of traveling lines in an opposite direction.

8. The circuit of claim 6, in which a first group of loopback connections connect emerging underutilized traveling lines to undriven traveling lines in a nonadjacent parallel channel.

9. The circuit of claim 8, in which a second group of loopback connections connect emerging underutilized pillar lines to undriven pillar lines in a nonadjacent parallel channel.

10. The circuit of claim 6, further comprising loopback connections which are made on two peripheral sides of the circuit.

11. The circuit of claim 8, in which the first group of loopback traces is formed in the same metal layer as the traveling lines.

12. The circuit of claim 9, in which the second group of loopback traces is formed in the same metal layer as the pillar lines.

13. The circuit of claim 1, in which the number and direction of pillar stubs attached to a pillar via varies between vertically adjacent crossbar arrays, in which the number of pillar stubs attached to a pillar via in a given crossbar array varies from 0 to 2.

14. The circuit of claim 1, in which the length of a bottommost segment of each traveling line is directly accessible along its length to vias extending upward from area distributed access gates in the access layer.

15. The circuit of claim 1, in which the pillar vias have an enhanced cross sectional area which reduces the electrical resistance of the pillar vias.

16. An extensible three dimensional circuit having parallel array channels comprising:
   an access layer;
   at least one crossbar array layer overlying the access layer and being electrically connected to the access layer, the crossbar array layer comprising parallel array channels wherein each array channel is bounded along one side by a first class of via and along an opposite side by a second class of via, each array channel comprising crossing lines where each line connects to a via such that each crossing point between the lines is uniquely addressed by one via of the first class and one via of the second class; and
   programmable crosspoint devices disposed at each crossing point and connected between the lines that cross at that crossing point.

17. The circuit of claim 16, further comprising a plurality of stacked crossbar array layers, in which interconnection vias make connections between traveling lines in adjacent array layers.

18. The circuit of claim 17, in which a number and direction of stubs attached to a via varies between vertically adjacent crossbar arrays, in which the number of pillar stubs attached to a via in a given crossbar array varies from 0 to 2.

19. The circuit of claim 16, in which the crossing lines comprising traveling lines, wherein traveling lines are oriented along a first channel in an opposite direction than the traveling lines in at least one adjacent channel.

20. The circuit of claim 16, further comprising loopback connections made between emerging underutilized lines and undriven lines at the periphery of the circuit.

* * * * *